United States Patent [19]

Pampalone et al.

[11] 4,355,094

[45] Oct. 19, 1982

[54] POSITIVE RADIATION SENSITIVE RESIST TERPOLYMERS

[75] Inventors: Thomas R. Pampalone, Belle Mead; Kurt B. Kilichowski, Mercerville, both of N.J.

[73] Assignee: RCA Corporation, New York, N.Y.

[21] Appl. No.: 244,104

[22] Filed: Mar. 16, 1981

[51] Int. Cl.³ .......................... G03C 1/00; B05D 3/06; C23F 1/00

[52] U.S. Cl. .................................... 430/286; 156/643; 427/43.1; 430/296; 430/326; 528/386

[58] Field of Search ................ 427/43.1, 44; 156/643; 528/386, 382; 430/296, 297, 326, 286

[56] References Cited

U.S. PATENT DOCUMENTS

| | | | |
|---|---|---|---|
| 3,898,350 | 8/1975 | Gipstein et al. | 427/43 |
| 3,935,331 | 1/1976 | Poliniak et al. | 427/43 |
| 3,935,332 | 1/1976 | Poliniak et al. | 427/43 |
| 4,097,618 | 6/1978 | Poliniak | 427/43.1 X |
| 4,153,741 | 5/1979 | Poliniak et al. | 427/38 |
| 4,263,385 | 4/1981 | Pampalone | 430/25 |

FOREIGN PATENT DOCUMENTS

| | | | |
|---|---|---|---|
| 519503 | 12/1955 | Canada | 528/386 |
| 610354 | 12/1960 | Canada | 528/386 |
| 515196 | 11/1939 | United Kingdom | 528/386 |

OTHER PUBLICATIONS

Hatzakis et al., J. Electrochem. Soc., Jan. 1979, pp. 154–161.

*Primary Examiner*—Norman Morgenstern
*Assistant Examiner*—Thurman K. Page
*Attorney, Agent, or Firm*—Birgit E. Morris; R. Hain Swope

[57] ABSTRACT

This invention relates to novel terpolymers of 3-methyl-cyclopentene, an omega alkynoic acid and sulfur dioxide. Positive radiation sensitive films prepared from the subject terpolymers adhere well to the substrate, demonstrate resistance to cracking and erosion during development and possess excellent edge definition.

8 Claims, No Drawings

POSITIVE RADIATION SENSITIVE RESIST TERPOLYMERS

This invention relates to novel sulfone terpolymers which are useful as positive radiation sensitive resist recording media for the manufacture of electronic devices including microelectronic circuits.

BACKGROUND OF THE INVENTION

Positive acting resist media sensitive to radiation, e.g. electron beam, and the use thereof in forming surface patterns in a variety of substrates are well known in the art. Poly(olefin sulfone) polymers are a major class of such positive resist media. For example, poly(1-methyl-1-cyclopentene sulfone) has been utilized for audio/video recording apparatus as described in Poliniak et al. U.S. Pat. Nos. 3,935,331 and 3,935,332. Poly(1-butene sulfone) has been employed for integrated circuit mask formation and poly(cyclopentene sulfone) and poly(bicycloheptene sulfone) have been employed for multilayer integrated circuit mask formation.

In general, surface relief patterns are formed in a layer of a poly(olefin sulfone) or poly(acetylene sulfone) copolymer by dissolving the polymer in a suitable solvent, forming a wet layer of the resulting solution on a substrate such as a metal, baking or vacuum drying the wet layer to remove the solvent, irradiating the dry layer with e.g. a modulated beam of electrons, and developing the copolymer layer with a solvent to yield the desired surface relief pattern. To be useful as a positive resist media, such a film must degrade upon irradiation, be developable in the exposed areas with good resolution, and be resistant to chemical etching solutions. Non-irradiated areas of the film must adhere well to the substrate and be resistant to cracking and crazing.

The choice of a specific polymer for use as a radiation sensitive resist media heretofore has necessitated a balancing of such properties. For example, in order to prepare a resist film having a high degree of sensitivity, one generally will select a polymeric material having high molecular weight and low molecular weight distribution. These parameters, however, usually contribute to polymer brittleness. The converse is often true with low molecular weight polymers. Other equally important criteria, such as retention of resist sensitivity and fine line resolution, must be balanced as well in selecting a polymeric material.

For example, a positive resist coating of poly(3-methylcyclopentene sulfone), such as is described in E. S. Poliniak et al., U.S. Pat. No. 4,153,741, when spun on a chromium substrate to a thickness greater than about 3000 angstroms may show varying degrees of cracking or crazing upon development, depending on the type and quality of the chrome substrate, the coating and baking procedures, and the characteristics of the resist material itself. The addition of a conventional plasticizer will eliminate cracking in such coatings up to a thickness of about 6000 angstroms. However, there is a concomitant deterioration in fine line resolution and resist sensitivity.

Poly(olefin sulfone) terpolymers and their use as radiation sensitive resist recording media are likewise known in the art. For example, Gipstein et al. in U.S. Pat. No. 3,898,350 disclose terpolymers formed from an alpha olefin, sulfur dioxide, and a compound selected from the group consisting of cyclopentene, bicycloheptene and methyl methacrylate.

Gipstein et al. indicate that poly(olefin sulfone) terpolymers such as are disclosed therein have lower glass transition temperatures and are, therefore, less brittle than copolymers made from the disclosed olefins, e.g. cyclopentene and bicycloheptene. The disclosed terpolymers are indicated as being resistant to cracking in films up to 9100 angstroms thick. In contrast, sulfur dioxide copolymers of the disclosed group of monomers represented by cyclopentene and bicycloheptene exhibit cracking in film thicknesses greater than about 3000 angstroms. The terpolymers disclosed by Gipstein et al. are of little practical value, however, since their sensitivities appear to be above the 1 $\mu C/cm^2$ dose level generally recognized as an upper limit for a commercial high throughput radiation sensitive resist.

The present invention is predicated on the discovery that small amounts of an omega alkynoic acid as a termonomer in a sulfone terpolymer significantly improve certain desirable characteristics of radiation sensitive resist media formed therefrom without loss in sensitivity.

SUMMARY OF THE INVENTION

In accordance with this invention, there are provided novel sulfone terpolymers suitable for the preparation of positive radiation sensitive recording media which are characterized by improved adhesion to the substrate, reduced cracking and crazing, significantly reduced erosion of non-irradiated areas during development and improved edge definition without loss in sensitivity in comparison to known poly(olefin sulfone) polymers conventionally utilized for such films.

DETAILED DESCRIPTION OF THE INVENTION

The novel sulfone terpolymers provided in accordance with the present invention are terpolymers of 3-methylcyclopentene, an omega alkynoic acid and sulfur dioxide. In terms of mole percentage, the terpolymers of this invention contain an organic monomer component i.e., 3-methylcyclopentene and an omega alkynoic acid, and sulfur dioxide in a 1:1 molar ratio.

The organic monomer component comprises from about 93 mole percent to about 99 mole percent of 3-methylcyclopentene and from about 1 mole percent to about 7 mole percent of an omega alkynoic acid. It has been found, in accordance with this invention, that reducing the content of omega alkynoic acid of the subject terpolymers substantially below about 1 mole percent of the monomer component will negate the improved resistance to cracking which characterizes the subject terpolymers. Further, increasing the content of omega alkynoic acid substantially above about 7 mole percent of the monomer component will not produce a corresponding increase in adhesion and resistance to cracking. As a practical matter, it is difficult to prepare the subject terpolymers with an acid content in excess of about 10 mole percent of the monomer component because of the differences in the relative reactivities of the monomers. Therefore, it is preferred, in accordance with this invention, that the monomer component of the subject terpolymers comprise from about 2 mole percent to about 3 mole percent of omega alkynoic acid and the remainder 3-methylcyclopentene.

The omega alkynoic acid termonomer of the terpolymers of this invention is selected from those represented by the formula

wherein n is an integer from 1 to 20. A preferred termonomer is selected from those of the above formula wherein n is an integer from 6 to 12, with 10-undecynoic acid, i.e. n equals 8, being especially preferred. The significant improvement in resist properties achieved by the inclusion of the omega alkynoic acid termonomers in the subject terpolymers is surprising, particularly in view of the fact that similar terpolymers prepared using corresponding alkenoic acids are clearly inferior in resist properties. For example, terpolymers of 3-methylcyclopentene, sulfur dioxide and allylacetic acid or 10-undecenoic acid, upon development after irradiation by electron beam, showed substantial erosion in non-irradiated areas leading to significant loss of edge definition. In contrast, the terpolymers of this invention show virtually no erosion in non-irradiated areas and have excellent edge definition.

The molecular weight of the terpolymers of this invention should be sufficiently high so that, when areas of films formed therefrom are irradiated by exposure to a radiation source, e.g. a modulated electron beam, there will be a sufficient reduction in molecular weight to cause a significant difference in the relative solubility of the irradiated and non-irradiated portions of the film. The molecular weight of the subject terpolymers is further important in terms of their solubility in the solvents used for casting such films. In general, the novel terpolymers of this invention preferably have a weight average molecular weight ($M_w$) of from about 400,000 to about 1,500,000, more preferably from about 700,000 to about 1,200,000, and a molecular weight distribution ($M_w/M_n$) of less than 4, wherein $M_n$ equals number average molecular weight.

The novel sulfone terpolymers of this invention can be prepared in a conventional manner by a free radical polymerization of the monomer component and sulfur dioxide in the presence of a conventional polymerization initiator such as, for example, t-butylhydroperoxide. The molecular weight of the terpolymer is controlled by the amount of polymerization initiator present with increased amounts giving lower molecular weights.

In order to apply the terpolymers of this invention to a substrate, the terpolymer is initially dissolved in a suitable organic solvent. The resulting solution is then coated onto the substrate in a conventional manner, e.g., by casting, spraying, spin coating and the like. The solution usually contains from about 1 percent by weight to about 20 percent by weight, preferably from about 6 percent by weight to about 10 percent by weight of the terpolymer. Suitable solvents should have boiling points below the decomposition point of the terpolymer, thus permitting removal of the solvent from the coating by conventional heating or vacuum drying. Removal of the solvent forms a uniform resist film of the terpolymer on the substrate. Examples of suitable solvents for the novel terpolymers of this invention include 2-methoxyethylacetate and cyclopentanone.

The films are formed on the substrate in various thicknesses from about 50 angstroms to about 10 microns, depending on the intended use of the resist image. It is preferred to bake the resist film in air or vacuum, usually at a temperature above the glass transition temperature of the terpolymer, but below its thermal decomposition point. It has been found that the resist performance of films of the terpolymers of this invention can be further improved in most instances by subsequently allowing the films to age for from one to several days, preferably at ambient temperature.

The recording medium resist films of the terpolymers of this invention are selectively irradiated with a source of radiation, e.g. a modulated electron beam, X-ray, gamma ray or the like, thereby causing degradation of the terpolymer in the irradiated areas. It is preferred, in accordance with the present invention, to irradiate the subject terpolymers with a modulated electron beam.

When utilized as positive-working resists, films of the terpolymers of this invention are cast to a thickness equal to or less than the depth of penetration of the radiation, thus uncovering the substrate underlying the irradiated areas upon development. Alternatively, the terpolymers of this invention can be employed as media for recording of surface relief patterns by irradiating thicker films to form well defined patterns which, upon development, correspond in relief to the information recorded.

Resist films formed from the novel terpolymers of this invention are developed after irradiation utilizing conventional solvents. A solvent may be utilized which develops both the irradiated and non-irradiated portions of the film but will dissolve the irradiated portions more rapidly. In this instance, resist thickness must be adjusted so that, in the non-irradiated areas, sufficient resist remains after development to protect the substrate during subsequent operations, e.g., etching. The resist film may also be developed with a solvent which exclusively dissolves the irradiated portion thus exposing the underlying substrate. This mode of development generally requires longer and more careful developing, but tends to give sharper resolution.

Suitable solvent developers for the terpolymers of this invention include, for example, 2-methoxyethylacetate, 2-methylcyclohexanone, ethylacetoacetate and the like. Since these developers will dissolve both the irradiated and non-irradiated portions of the resist, it is preferred to utilize as a solvent system a combination of such a solvent and a compatible non-solvent for the resist film, usually an alcohol such as, for example, isopropanol, ethoxyethanol, 2-methylcyclohexanol and the like. The formulation of such solvent/non-solvent combinations which will fully develop irradiated resist film while eroding only an insignificant portion of the non-irradiated resist is conventional in the art. In such systems, the effect of the non-solvent is to retard the developing action of the solvent thereby affording more carefully controlled development.

The resist film, after removal of the irradiated portion, may provide a pattern on the substrate which is used as a guide for the formation of circuits and the like. The substrates which may be advantageously so treated include, for example, conductive plastic or a conductive plastic laminate, porcelain-coated steel, silicon wafers, chrome- or nickel-coated glass, and the like, on which it is desired to form a microelectronic circuit. In particular, resist films formed from the terpolymers of this invention are useful for the production of chrome masks which are in turn useful in the production of electronic devices. Exposed portions of the surface of the substrate, defined by the terpolymer resist, are etched by conventional etchant, e.g. ferric chloride solutions for steel, hydrofluoric acid solutions for glass and the like.

The following examples further illustrate this invention, it being understood that the invention is in no way intended to be limited to the details described therein. In the examples, all parts and percentages are on a weight basis unless otherwise stated.

EXAMPLE 1

A solution of 8 gm 3-methylcyclopentene, 0.4 gm 10-undecynoic acid and 0.1 ml of t-butylhydroperoxide as a polymerization initiator was added dropwise to 30 ml of liquid sulfur dioxide with stirring at $-30°$ C. under an inert atmosphere. After addition of the solution was completed, the excess sulfur dioxide was allowed to boil off. The residue was dissolved in 100 ml tetrahydrofuran and the resulting solution slowly poured into 250 ml methanol with agitation to precipitate the terpolymer product. The product was collected by filtration, reprecipitated from tetrahydrofuran with methanol and dried overnight in a vacuum oven. Comparative quantitative infrared analysis of the product showed it to be comprised of 3-methylcyclopentene/10-undecynoic acid/sulfur dioxide in a molar ratio of 97.5:2.5:100, yield greater than 70 percent. Molecular weight analysis by gel permeation chromatography showed $M_w = 1,219,571$, $M_n = 412,431$ and $M_w/M_n = 3.0$.

EXAMPLE 2

For comparative purposes, a copolymer was prepared by dissolving 10 grams of 3-methylcyclopentene and 0.25 ml t-butylhydroperoxide in 10 ml methylene chloride to form a solution which was added dropwise to a solution of 15 ml anhydrous ethanol in 30 ml liquid sulfur dioxide at $-30°$ C. under an inert atmosphere. After completion of the addition, the excess sulfur dioxide was allowed to boil off and the precipitated product recovered and purified in accordance with the procedure of Example 1.

EXAMPLE 3

In order to demonstrate the enhanced adhesion of the terpolymers of this invention to a substrate, an undercut test was performed as follows. An 8 percent by weight solution of the terpolymer of Example 1 in 2-methoxyethylacetate was coated to approximately 5000 angstroms on a chromium/glass substrate. The coating was baked for 30 minutes at $95°$ C. and then allowed to stand at ambient temperature for 24 hours. The coating, in each instance, was scored to the chromium and treated with a conventional cerric ammonium nitrate/glacial acetic acid chromium etching solution for five minutes. The degree of undercut, which is recognized as a definitive indicator of resist adhesion, was measured visually utilizing an optical microscope. The degree of undercut for this resist was less than 0.005 mm, which is the limit of observation. In contrast, a film of the 3-methylcyclopentene/sulfur dioxide copolymer of Example 2 treated in a like manner showed an undercut of 0.025 mm. The degree of adhesion is particularly important with regard to chromium etching since poor adhesion causes the developed film to lift off the substrate resulting in a loss of fine lines and edge definition.

EXAMPLE 4

In order to demonstrate the improvement in resistance to cracking of the terpolymers of this invention, a sample of the terpolymer of Example 1 was treated according to the following procedure.

The terpolymer sample was dissolved in 2-methoxyethylacetate and spun to various thicknesses on a chromium/glass substrate, baked at $95°$ C. for 30 minutes, and allowed to stand at ambient temperature for 24 hours. The films were placed in a developer consisting of an equal mixture of 2-methylcyclohexanone and 2-methylcyclohexanol for from 70–130 seconds, depending on their thickness. The samples were then dipped in an isopropanol stopper, air dried, and observed under a microscope. In most instances, no cracking or significantly reduced cracking was observed with the present terpolymers in comparison to the copolymer of Example 2. The copolymer demonstrated cracking at thicknesses in excess of 5000 angstroms whereas the terpolymer containing as little as 2.5 mole percent 10-undecynoic acid did not demonstrate cracking below about 8800 angstroms. The terpolymer had the same sensitivity ($0.8 \mu C/cm^2$) as the corresponding copolymer.

EXAMPLE 5

Films of the terpolymer of Example 1 were cast on chromium/glass substrates to a thickness of 5000 angstroms in the manner of Example 3. Films of the copolymer of Example 2 were prepared in a similar manner. The films were irradiated by electron beam radiation through a mask consisting of 3 mm bars and spaces at a dose of $0.8 \mu C/cm^2$. The terpolymer film was developed with a 55:45 mixture of 2-methylcyclohexanone and 2-methylcyclohexanol. The terpolymer film showed excellent pattern definition and less than one percent erosion in the non-irradiated areas. In contrast, the copolymer film, which was developed with a 60:40 mixture of the same solvents, was judged clearly inferior in pattern definition and had approximately 4 percent erosion in the non-irradiated areas.

EXAMPLES 6–10

Terpolymers were prepared having varying ratios of 3-methylcyclopentene and 10-undecynoic acid. In each instance, the organic monomer component and 0.25 ml t-butylhydroperoxide were dissolved in 10 ml methylene chloride and the resulting solution added dropwise to a solution of 15 ml anhydrous ethanol in 30 ml liquid sulfur dioxide with agitation at $-30°$ C. under an inert atmosphere. After completion of the addition, the excess sulfur dioxide was allowed to boil off. Each product was recovered and purified in accordance with the procedure of Example 1. The composition of each product was determined by comparative quantitative infrared spectroscopy.

EXAMPLE 11

A solution of 4.0 g 3-methylcyclopentene and 0.5 ml t-butylhydroperoxide was slowly added to a stirred solution of 6.0 g 10-undecynoic acid in 30 ml liquid sulfur dioxide in a reaction vessel at $-10°$ C. under an inert atmosphere. After the addition was completed, the excess sulfur dioxide was allowed to boil off.

The residue was dissolved in 100 ml tetrahydrofuran and the solution poured slowly into 250 ml of anhydrous diethyl ether with stirring to precipitate the terpolymer product. The product was reprecipitated in the same manner, dried overnight in a vacuum oven and analyzed by comparative quantitative infrared spectroscopy.

Each of the terpolymers prepared in Examples 6 through 11 was tested according to the procedure of Example 4. In each instance, the minimum film thickness which showed evidence of cracking was determined. The results are given in Table I.

TABLE I

| Terpolymer of Example | Reactants (in Gms) 3-MCP* | Acid** | Mole Percent Acid** in Product | Minimum Cracking Thickness (μm) |
|---|---|---|---|---|
| 6 | 9 | 0.25 | ≈1.0*** | 0.62 |
| 7 | 8 | 0.4 | 2.5 | 0.88 |
| 8 | 7.5 | 0.8 | 3.4 | 0.96 |
| 9 | 10 | 3 | 3.3 | 1.00 |
| 10 | 4 | 4 | 4.0 | 0.96 |
| 11 | 4 | 6 | 9.6 | 1.07 |

*3-methylcyclopentene
**10-undecynoic acid
***One mole percent acid represents the limit of detection of acid content of the terpolymer.

The data in Table I shows reduced cracking up to a film thickness of about 1 μm. Minimum cracking thickness does not appreciably increase beyond 1 μm despite further increases in the acid content of the terpolymer. In contrast, a film of the copolymer of Example 2 treated in the same manner showed a minimum cracking thickness of 0.56 μm.

EXAMPLE 12

Eight percent by weight solutions of the terpolymer of Example 1 and the copolymer of Example 2, respectively, in 2-methoxyethylacetate were cast on chromium/coated glass to a thickness of 0.5 μm. The films were dried at 90° C. for 30 minutes and allowed to age overnight at room temperature. The films were irradiated with a computer controlled scanning electron beam in a pattern consisting of 3,1 and 0.5 μm lines at a dose of 0.8 μC/cm². After irradiation, the films were developed for one and one-half minutes with mixtures of 2-methylcyclohexane and 2-methylcyclohexanol in ratios of 55:45 and 60:40, respectively. Development was stopped by immersing the film in an alcohol stopper. The films were dried with compressed air, dipped in a conventional cerric ammonium nitrate/glacial acetic acid chromium etching solution for three minutes, rinsed with water and dried. Under a scanning electron microscope, the terpolymer film showed good edge definition of lines with resolution better than 1 μm. The copolymer film, in contrast, showed undercutting and poor edge definition which is characteristic of adhesion failure. One micron lines were missing and areas or "islands" of non-irradiated resist film tended to lift off of the substrate allowing the chromium etch solution to etch substrate which should have been protected further resulting in a significant loss of resolution.

We claim:
1. A method of forming a patterned layer on a substrate comprising:
   (a) coating the subject with a composition comprising a terpolymer comprising an organic monomer component and sulfur dioxide in a 1:1 molar ratio, said monomer component being comprised of 3-methylcyclopentene, and an omega alkynoic acid represented by the formula

$$CH \equiv C-(CH_2)_n-COOH$$

wherein n is an integer from 1 to 20, and a suitable solvent therefor;
   (b) drying said coating to form a positive recording medium;
   (c) irradiating selected portions of said medium and
   (d) developing the irradiated portions of said medium with a suitable developer.
2. The method in accordance with claim 1, wherein said composition contains from about 1 percent by weight to about 20 percent by weight of said terpolymer.
3. The method in accordance with claim 2, wherein said composition contains from about 6 percent by weight to about 10 percent by weight of said terpolymer.
4. The method in accordance with claim 1, wherein said solvent is 2-methoxyethylacetate or cyclopentanone.
5. A method in accordance with claim 1, wherein said medium is irradiated with a source of modulated electron beam.
6. A method in accordance with claim 1, wherein said development exposes corresponding portions of the substrate.
7. A method in accordance with claim 6 additionally including etching the exposed substrate with a suitable etchant.
8. A positive recording medium comprising a substrate and a radiation sensitive film applied to a surface of the substrate, said film comprised of a terpolymer comprising an organic monomer component and sulfur dioxide in a 1:1 molar ratio, said monomer component being comprised of 3-methylcyclopentene, and an omega alkynoic acid represented by the formula $$CH \equiv C-(CH_2)_n-COOH$$

wherein n is an integer from 1 to 20.

* * * * *